(12) United States Patent  
Yamaguchi

(10) Patent No.: US 7,031,164 B2
(45) Date of Patent: Apr. 18, 2006

(54) ELECTRONIC CIRCUIT DEVICE INCLUDING HEAT-GENERATING ELEMENT MOUNTED ON CIRCUIT BOARD

(75) Inventor: Atsushi Yamaguchi, Kariya (JP)

(73) Assignee: Denso Corporation, Kariya (JP)

( * ) Notice: Subject to any disclaimer, the term of this patent is extended or adjusted under 35 U.S.C. 154(b) by 159 days.

(21) Appl. No.: 10/636,623

(22) Filed: Aug. 8, 2003

(65) Prior Publication Data

US 2004/0042180 A1    Mar. 4, 2004

(30) Foreign Application Priority Data

Aug. 29, 2002   (JP)   .............................. 2002-250694

(51) Int. Cl.
*H05K 7/20*   (2006.01)

(52) U.S. Cl. ........................ 361/719; 174/252; 361/720
(58) Field of Classification Search ................ 174/252; 257/706–707, 712–713; 361/704, 707, 719–720, 361/712–713
See application file for complete search history.

(56) References Cited

U.S. PATENT DOCUMENTS

| | | | | | |
|---|---|---|---|---|---|
| 4,941,067 | A | * | 7/1990 | Craft | ........................... 361/721 |
| 5,258,887 | A | * | 11/1993 | Fortune | ...................... 361/720 |
| 5,307,237 | A | * | 4/1994 | Walz | ........................... 361/718 |
| 6,043,986 | A | * | 3/2000 | Kondo et al. | ................ 361/720 |
| 6,156,980 | A | * | 12/2000 | Peugh et al. | ................. 174/252 |
| 6,477,054 | B1 | * | 11/2002 | Hagerup | ...................... 361/720 |

FOREIGN PATENT DOCUMENTS

JP           A-7-79053         3/1995

* cited by examiner

*Primary Examiner*—Gregory Thompson
(74) *Attorney, Agent, or Firm*—Posz Law Group, PLC

(57) ABSTRACT

An electronic circuit device including a heat-generating element is mounted on a circuit board composed of three laminated layers: a heat-receiving layer on which the heat-generating element is mounted, an insulating layer, and a heat-dissipating layer. The heat-receiving layer is connected to the heat-dissipating layer through heat-conductive passages formed in the insulating layer. The heat generated in the heat-generating element is transferred to the heat-dissipating layer through the heat-conductive passages, and the heat is efficiently dissipated on both the heat-receiving layer and the heat-dissipating layer.

7 Claims, 2 Drawing Sheets

ELECTRONIC CIRCUIT DEVICE INCLUDING HEAT-GENERATING ELEMENT MOUNTED ON CIRCUIT BOARD

CROSS-REFERENCE TO RELATED APPLICATION

This application is based upon and claims benefit of priority of Japanese Patent Application No. 2002-250694 filed on Aug. 29, 2002, the content of which is incorporated herein by reference.

BACKGROUND OF THE INVENTION

1. Field of the Invention

The present invention relates to an electronic circuit device that includes a heat-generating element such as a power transistor mounted on a circuit board.

2. Description of Related Art

An electronic circuit often includes a heat-generating element such as a power transistor. If such a heat-generating element mounted on a circuit board heats up a circuit beyond a permissible temperature, the circuit may malfunction or the circuit may be damaged. Therefore, it is very important to properly dissipate heat generated in the electronic circuit.

For properly dissipating heat generated in an electronic circuit, it is required to provide a sufficient heat-dissipating space around the heat-generating element mounted on a circuit board. However, providing a large space for heat dissipation is contradictory to a down-sizing requirement. To cope with this problem, JP-A-7-79053 proposes a structure for dissipating heat generated in a power element mounted on a circuit board. The power element is mounted on an upper surface of the circuit board, and heat generated in the power element is transferred to an inner layer provided in the circuit board through a heat-conductive path formed underneath the power element. In this structure, however, the heat-conductive path is made only from the upper surface to a center portion of the circuit board. In other words, the heat-conductive path does not reach a lower surface of the circuit board. Therefore, the heat is not sufficiently dissipated from the circuit board to an atmospheric space. In addition, it is required to make a relatively large heat-conductive path underneath the power element, and therefore the structure becomes complex and the manufacturing cost becomes high.

SUMMARY OF THE INVENTION

The present invention has been made in view of the above-mentioned problem, and an object of the present invention is to provide an improved electronic circuit device, in which heat generated therein is sufficiently dissipated. Another object of the present invention is to provide a circuit board that is able to easily dissipate heat generated in a circuit device mounted thereon.

An electronic circuit device including a heat-generating element such as a power transistor is mounted on a surface of a circuit board. The circuit board is composed of an insulating layer, an upper layer laminated on an upper surface of the insulating layer and a lower layer laminated on a lower surface of the insulating layer. Circuit patterns are formed on the upper and lower layers, and the heat-generating element is mounted on the upper layer. The upper layer functions as a heat-receiving layer, and the lower layer as a heat-dissipating layer because the lower layer is connected to the upper layer through heat-conductive passages.

The heat-conductive passages are formed by filling through-holes formed in the insulating layer with a heat-conductive material such as solder. Heat generated in the heat-generating element mounted on the heat-receiving layer (upper layer) is transferred to the heat-dissipating layer (lower layer). Therefore, the heat is dissipated on both the upper and the lower layers.

The heat-generating element is mounted on the heat-receiving layer by soldering. In the soldering process, heat for melting the solder has to be kept in the soldering region. Therefore, it is preferable to form a pattern for suppressing heat dispersion around the soldering area. The suppressing pattern may be composed of plural discrete holes formed on the heat-receiving layer and thermal passages between neighboring holes. To keep the soldering heat in the soldering area while the soldering process is being performed, the through-holes are filled with the solder after the soldering process is completed or at the same time as the soldering is being carried out. It is also preferable to mount the heat-generating element on an area where a circuit pattern for grounding is formed. This is because there occurs no noise problem if the circuit pattern for grounding is heated by the heat of the heat-generating element.

According to the present invention, the heat generated in the heat-generating element mounted on the circuit board is efficiently dissipated without adding a complex heat-dissipating structure to the circuit board. Other objects and features of the present invention will become more readily apparent from a better understanding of the preferred embodiment described below with reference to the following drawings.

DETAILED DESCRIPTION OF THE PREFERRED EMBODIMENT

Figure 1:
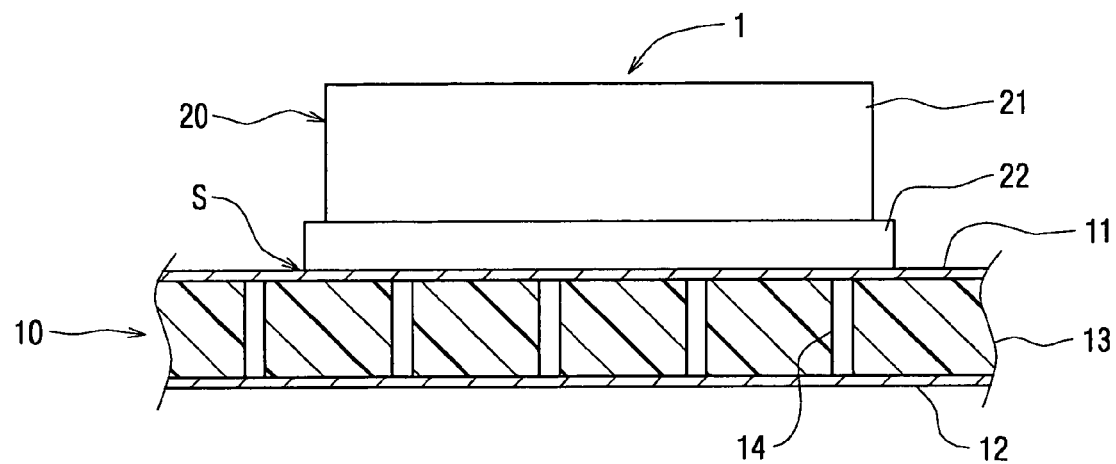
FIG. 1 is a cross-sectional view showing an electronic circuit device according to the present invention.

A preferred embodiment of the present invention will be described with reference to accompanying drawings. In FIG. 1, a portion of an electronic circuit device 1 such as a power module is shown. The power module 1, for example, is an inverter device for controlling a three-phase induction motor. The power module 1 is composed of various electronic components including a heat-generating element such as a power transistor 20. The various electronic components are mounted on a circuit board 10.

The circuit board 10 is composed of three laminated layers: a heat-receiving layer 11, made of copper, on which the power transistor 20 is mounted; an insulating layer 13 made of an insulating material such as glass-epoxy; and a heat-dissipating layer 12. Circuit patterns are formed on both layers 11 and 12 by a known process, such as screen printing and etching. The power transistor 20 is composed of a chip 21 and a heat sink plate 22 on which the chip 21 is connected. The power transistor 20 is mounted on a mounting region S on the heat-receiving layer 11. The circuit patterns formed on both the heat-receiving player 11 and the heat-dissipating layer 12 in regions corresponding to the mounting region S are grounding patterns.

The circuit board 10 includes a plurality of through-holes 14 formed through the insulating layer 13 and positioned to surround the mounting region S. The through-holes 14 are filled with solder, thereby forming heat-conductive passages connecting the heat-receiving layer 11 and the heat-dissipating layer 12. The through-holes 14 are filled with the solder at the same time when the heat sink plate 22 of the power transistor 20 is connected to the heat-receiving layer 11 by soldering. A pattern T (explained later) is further formed outside the through-holes. A terminal (not shown) led out of the power transistor 20 is connected to a circuit pattern formed on the heat-receiving layer 11.

Figure 2:
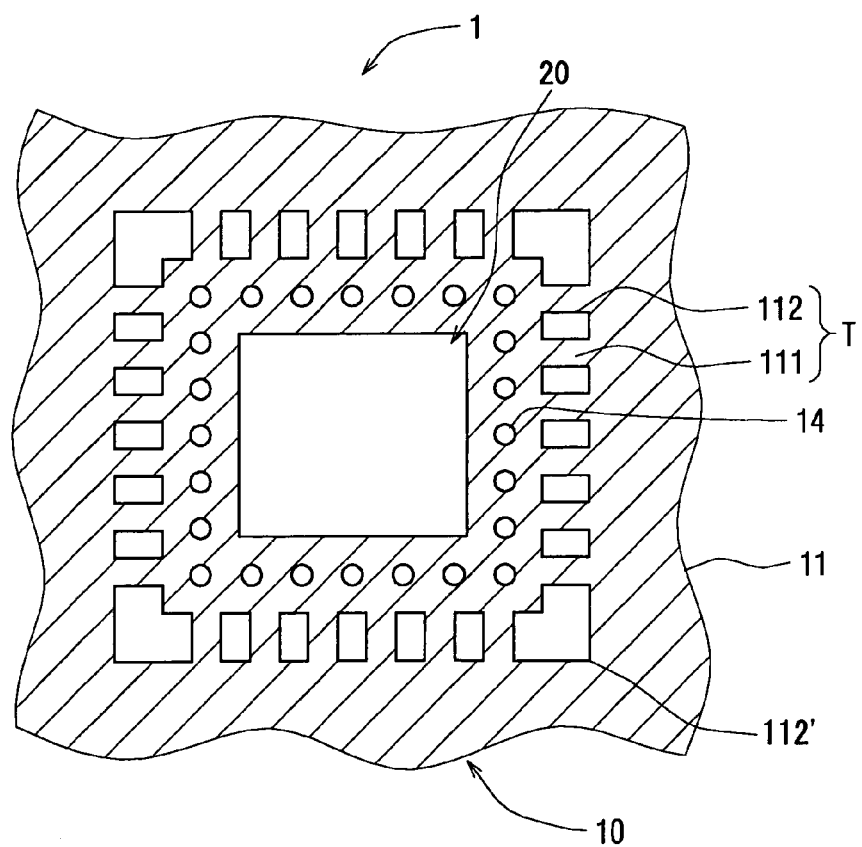
FIG. 2 is a plan view showing a heat-receiving layer on which a heat-generating element such as a power transistor is mounted.
Figure 3:
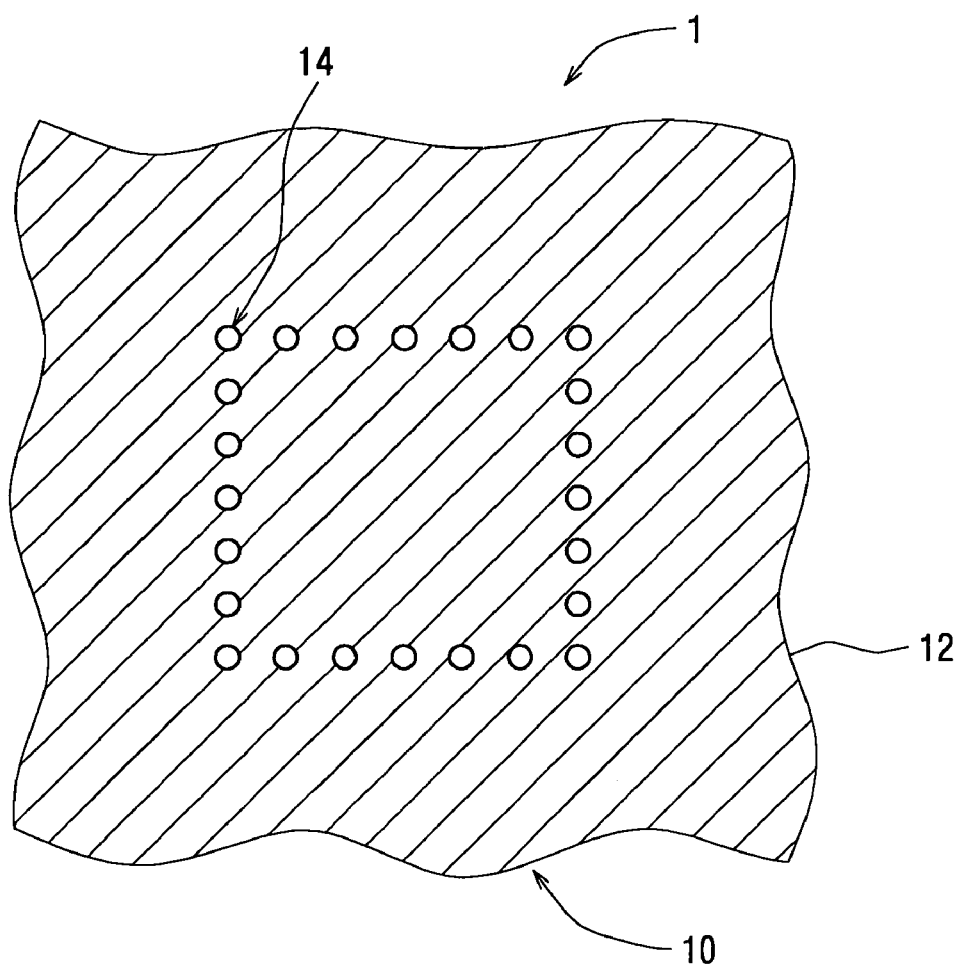
FIG. 3 is a plan view showing a heat-dissipating layer from which heat generated in the heat-generating element is dissipated.

The through-holes 14 and the pattern T are positioned on the heat-receiving layer 11 as shown in FIG. 2. The through-holes 14 are positioned on the heat-dissipating layer 12 as shown in FIG. 3. Each through-hole 14 is a small round hole discretely formed outside the substantially square power transistor 20. The pattern T is formed to surround the through-holes 14. The pattern T is composed of a plurality of holes 112 made on the heat-receiving layer 11 and a plurality of thermal passages 111 formed between neighboring holes 112. The holes 112' located at corners of the pattern T are formed in an angled shape to uniformly disperse heat from the inside of the pattern T to its outside. The through-hole 14 is positioned in the vicinity of the thermal passage 111 in order to efficiently lead the heat generated in the power transistor 20 to the through-hole 14.

Since the heat-receiving layer 11 on which the power transistor 20 is mounted is connected to the heat-dissipating layer 12 through the heat-conductive passages made of the solder filling the through-holes 14, the heat generated in the power transistor 20 is dissipated from both layers 11 and 12. It is preferable to form the grounding patterns on both layers 11, 12 corresponding to the mounting region S, because no noise problem occurs in this case even if both layers 11, 12 are heated to a high temperature by the heat generated in the power transistor 20.

Since the through-holes 14 are filled with solder at the same time when the power transistor 20 is soldered on the heat-receiving layer 11, no additional process is required to from the heat-conductive passages. However, it is possible to fill the through-holes 14 with other heat-conductive materials.

When the power transistor 20 is soldered on the heat-receiving layer 11, the heat for melting the solder has to be kept around the soldering position. On the contrary, the heat generated in the power transistor 20 when the circuit is in operation has to be dissipated. For suppressing heat dispersion in the soldering process, the pattern T composed of the thermal passages 111 and the holes 112 is formed outside the through-holes 14. Because the heat dispersion passages are restricted by the holes 112 formed on the heat-receiving layer 11, the heat in the soldering process is dispersed only through the thermal passages 111. If the heat-conductive passages were formed in the through-holes 14 before the soldering process, the heat necessary for soldering would be dispersed through the heat-conductive passages. To avoid this situation, the through-holes 14 are filled with the solder only after the power transistor 20 is soldered, or at the same time when the power transistor 20 is being soldered.

The present invention is not limited to the embodiment described above, but it may be variously modified. For example, though the through-holes 14 are formed inside the pattern T for suppressing heat dispersion in the foregoing embodiment, it is possible to form the pattern T inside the through-holes 14. Though the through-hole 14 is formed in a round shape, it may be formed in other shapes such as a square, rectangular or triangular shape. Also, the shape of the holes 112 constituting the pattern T is not limited to the rectangular shape as shown in FIG. 2. The holes 112 may be formed in other shapes such as a round or triangular shape.

The heat dissipating efficiency can be enhanced by increasing the number of heat-conductive passages, but a mechanical strength of the circuit board 10 decreases. Therefore, the number of the heat-conductive passages is set to an appropriate number that satisfies both the mechanical strength and the heat dissipating efficiency. Though only one power transistor 20 is shown in the foregoing drawings, more than two power transistors 20 may be mounted in the same manner as described above. When many heat-generating elements are mounted on the circuit board 10, the through-holes and the pattern T may be commonly used for neighboring heat-generating elements.

While the present invention has been shown and described with reference to the foregoing preferred embodiment, it will be apparent to those skilled in the art that changes in form and detail may be made therein without departing from the scope of the invention as defined in the appended claims.

What is claimed is:

1. An electronic circuit device comprising:
   a circuit board including a heat-receiving layer, an insulating layer and a heat-dissipating layer, all the layers being laminated in this order;
   heat-conductive passages formed through the insulating layer for connecting the heat-receiving layer and the heat-dissipating layer; and
   a heat generating element mounted on the heat-receiving layer, wherein:
   a pattern for suppressing heat dispersion from a mounting region in which the heat-generating element is mounted is formed on the heat-receiving layer.

2. The electronic circuit device as in claim 1, wherein:
   each of the heat-conductive passages is composed of a through-hole formed through the insulating layer and a heat-conductive material filling the through-hole.

3. The electronic circuit device as in claim 1, wherein:
   the heat-conductive passages are formed within the mounting region or along an outer periphery of the mounting region.

4. The electronic circuit device as in claim 1, wherein:
   a circuit pattern for grounding the electronic circuit device is formed on either the heat-receiving layer or the heat-dissipating layer, or on both layers.

5. The electronic circuit device as in claim 1, wherein:
   the suppressing pattern includes a plurality of discrete holes formed on the heat-receiving layer around the mounting region and thermal passages formed between the neighboring discrete holes.

6. The electronic circuit device as in claim 5, wherein:
   the heat-conductive passages are formed in the vicinity of the thermal passages of the suppressing pattern.

7. A circuit board for mounting thereon an electronic circuit device including a heat-generating element, the circuit board comprising:
   a heat-receiving layer for mounting the heat-generating element thereon;
   a heat-dissipating layer;
   an insulating layer laminated between the heat-receiving layer and the heat-dissipating layer; and
   heat-conductive passages, formed through the insulating layer, connecting the heat-receiving layer and the heat-dissipating layer, wherein
   the heat-receiving layer includes a pattern formed thereon for suppressing heat dispersion from a mounting region in which the heat-generating element is mounted.

* * * * *